United States Patent
Cho et al.

(10) Patent No.: US 6,635,502 B1
(45) Date of Patent: Oct. 21, 2003

(54) METHOD OF MANUFACTURING SEMICONDUCTOR OPTICAL DEVICES

(75) Inventors: Si Hyung Cho, Silver Spring, MD (US); William Crossley Dautremont-Smith, Orefield, PA (US); Sun-Yuan Huang, Union City, CA (US); Charles H Joyner, Red Bank, NJ (US); Ronald Eugene Leibenguth, Palmerton, PA (US); Abdallah Ougazzaden, Breinigsville, PA (US); Claude Lewis Reynolds, Jr., Sinking Spring, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 190 days.

(21) Appl. No.: 09/741,358

(22) Filed: Dec. 20, 2000

(51) Int. Cl.$^7$ ............................................. H01L 21/00
(52) U.S. Cl. ...................................................... 438/22
(58) Field of Search ............................... 438/22, 42, 46

(56) References Cited

U.S. PATENT DOCUMENTS

| | | | | |
|---|---|---|---|---|
| 5,425,042 A | * | 6/1995 | Nido et al. | 372/45 |
| 5,539,762 A | | 7/1996 | Belenky et al. | 372/46 |

* cited by examiner

*Primary Examiner*—Richard Elms
*Assistant Examiner*—Beth E. Owens
(74) *Attorney, Agent, or Firm*—Sean P. Fitzgerald

(57) ABSTRACT

The invention is a semiconductor optical device and method of fabrication where the device includes an active region with an active layer having a first index of refraction, and a blocking region having a second, lower index of refraction. A semiconductor layer having an index of refraction higher than the blocking region is formed over both the active and blocking regions so that the semiconductor layer is in closer proximity to the active layer in areas not covered by the blocking region so as to decrease the difference between the effective index of refraction in the active region and the effective refractive index of the blocking region. Such devices are particularly useful for pumping optical amplifiers since greater power can be achieved while maintaining single mode emission.

7 Claims, 3 Drawing Sheets

METHOD OF MANUFACTURING SEMICONDUCTOR OPTICAL DEVICES

FIELD OF THE INVENTION

This invention relates to semiconductor optical devices such as lasers and optical amplifiers.

BACKGROUND OF THE INVENTION

Optical Networks are currently of great interest primarily due to their ability to carry a large amount of information. Particularly significant are Dense Wavelength Division Multiplexing (DWDM) Systems which carry several wavelengths in a single optical fiber. Important components of such systems are Erbium-Doped Fiber Amplifiers (EDFAs) and Raman fiber amplifiers, which allow long-haul transmission of the signal light without regeneration. These amplifiers operate by pumping of charge carriers in the fiber with pump lasers to cause amplification of the signal light. The amplification is a strong function of the pump power, particularly for systems carrying several channels. For example, in a typical 80-channel system, two 980 nm pump lasers and four 1480 nm pump lasers, each operating at 150 mW, are employed for an EDFA. In systems using Raman amplifiers, four or more pump lasers at multiple wavelengths are typically used.

It is desirable, therefore, to increase the power generated by a pump laser in order to simplify the system. This can be done, for example, by increasing the length of the laser chip, but this tends to increase internal optical losses. The width of the active region of the laser could also be increased, but this typically produces an unwanted additional transverse mode. Another possibility is to use a Master Oscillator Power Amplifier structure, but this introduces complexity in fabrication and difficulty in coupling the pump light into a single mode fiber. (See, e.g., Cho, et al, "1.9-W Quasi-CW from a Near-Diffraction-Limited 1.55-micron InGaAsP-InP Tapered Laser," IEEE Photonics Technology Letters, vol. 10, No. 8, pp1091–10 93 August 1998)).

It is desirable, therefore, to increase the power of a laser emitting light in a single mode. It is also desirable to increase the power of semiconductor optical amplifiers.

SUMMARY OF THE INVENTION

The invention in one aspect is a semiconductor optical device which includes an active region with an active layer having a first index of refraction, and a blocking region having a second, lower index of refraction. A fundamental mode is generated in the active layer when a bias is applied to the device, the mode experiencing effective refractive indices in the active and blocking regions. A semiconductor layer having an index of refraction higher than the blocking region is formed over both the active and blocking regions so that the layer is in closer proximity to the active layer in areas not covered by the blocking region so as to decrease the difference between the effective refractive index of the active region and the effective refractive index of the blocking region.

In accordance with another aspect, the invention is apparatus which includes an optical amplifier, and a semiconductor pump laser coupled to the amplifier. The laser includes an active region with an active layer having a first index of refraction, and a blocking region having a second, lower index of refraction. A fundamental mode is generated in the active layer when a bias is applied to the device, the mode experiencing effective refractive indices in the active and blocking regions. A semiconductor layer having an index of refraction higher than the blocking region is formed over both the active and blocking regions so that the layer is in closer proximity to the active layer in areas not covered by the blocking region so as to decrease the difference between the effective refractive index of the active region and the effective refractive index of the blocking region.

In accordance with the farther aspect, the invention is a method of forming a semiconductor optical device including the steps of forming an active layer having a first index of refraction, and forming a blocking region having a second, lower index of refraction. A fundamental mode is generated in the active layer when a bias is applied to the device, the mode experiencing effective refractive indices in the active and blocking region so that a semiconductor layer having an index of refraction between that of the blocking region and the active layer is formed over both the active and blocking regions so that the layer is in closer proximity to the active layer in areas not covered by the blocking region so as to decrease the difference between the effective refractive index of the active region and the effective refractive index of the blocking region.

BRIEF DESCRIPTION OF THE FIGURES

These and other features of the invention are delineated in detail in the description to follow. In the drawing.

It will be appreciated that, for purposes of illustration, these figures are not necessarily drawn to scale.

DETAILED DESCRIPTION

Figure 1:
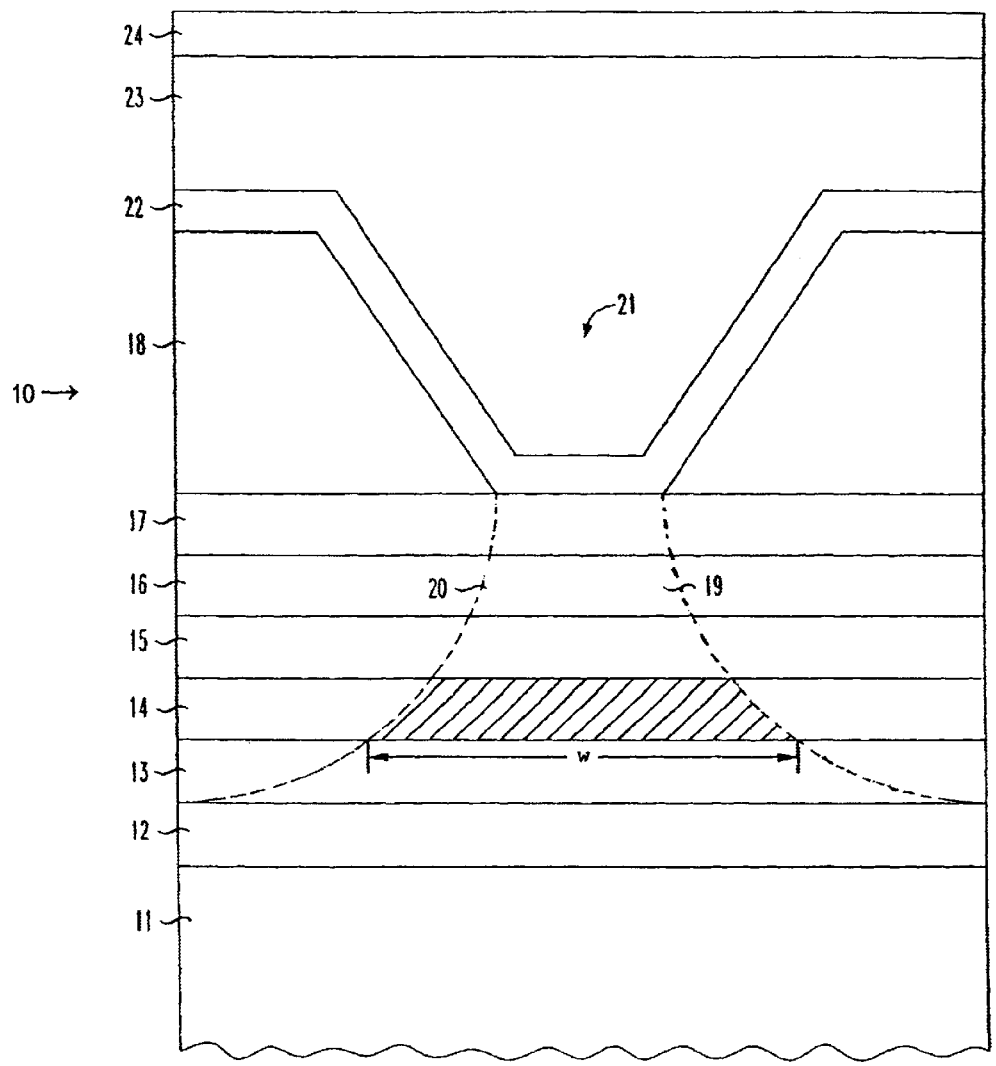
FIG. 1 is a cross sectional view of a semiconductor laser incorporating features of the invention in accordance with one embodiment.

FIG. 1 illustrates a typical semiconductor laser, 10, which utilizes the present invention in accordance with one embodiment. The particular structure shown is an overgrown etched channel laser, but it will be appreciated that other semiconductor lasers may also incorporate features of the invention. (For information regarding etched channel lasers, see, U.S. Pat. No. 5,539,762 issued to Belenky et al.)

The laser structure is formed on a semiconductor substrate, 11, which in this example comprises n-type InP covered by an n-type buffer layer (not separately shown). Formed on the substrate, usually by Metal Organic Chemical Vapor Deposition (MOCVD), is a first layer, 12, which in this example comprises InGaAsP with a thickness of approximately 300 angstroms. Formed on the cladding layer, again by MOCVD is a second layer, 13, preferably comprising InGaAsP with a thickness of approximately 100 angstroms. The layers, 12 and 13, together form a stepped bandgap Separate Confinement Layer (SCL) as known in the art.

Formed on the layer, 13, again preferably by MOCVD, is the active layer, 14, of the laser. In this example, the active layer was a multi-quantum well design including multiple well layers of InGaAsP separated by barrier layers comprising InGaAsP of a different higher bandgap composition. It will be appreciated that this composition is only illustrative, and the invention may be used with any type of semiconductor active layer. In this example, the active well thickness is approximately 40 angstroms, and the overall active layer thickness is approximately 500 angstroms.

A first layer, 15, of a stepped separate confinement layer (SCL) is formed on the active layer, 14, again preferably by MOCVD. In this example, the layer, 15, is an InGaAsP layer with a thickness of approximately 100 angstroms. Formed on the SCL is an electron stopper layer, 16, preferably comprising InAlAs with a thickness of approximately 200 angstroms. (For more details on electron stopper layers, see U.S. Pat. No. 5,539,762 issued to Belenky et al cited previously.) The layer, 16, is also preferably formed by MOCVD. The second SCL layer, 17, of the stepped SCL is formed on the stopper layer, again by MOCVD. This layer is also InGaAsP but with a slightly different composition from layer 15. The inclusion of this additional SCL layer is preferred since it aids in adjustment of the effective index of refraction as discussed below. Generally, layer 17 will have a thickness of 300 angstroms, and an index of refraction similar to that of layer 12.

A blocking layer of n-InP, 18, was formed over essentially the entire surface of the layer, 17, again by MOCVD, and then etched by standard photolithography to form a window, 21, in order to expose the portion of layer, 17, and the underlying layers which will comprise the active region of the device. The width of the etched window, 21, at the surface of the layer 17 helps define the width of the active region, which is illustrated by dashed lines 19 and 20. (Dashed lines 19 and 20 represent the extent of current spreading in the structure when a bias is applied and therefore define the width of the active region. The width, w, is the width of the active region in the active layer, 14.) The blocking layer in this example is n-type InP with a thickness of approximately 0.60 microns, but it will be understood that other materials which block an electrical bias to areas outside the active region may be utilized. Preferably, the material is a single crystal epitaxial insulator which is lattice matched to the underlying semiconductor. It is also preferred that it be selectively etched with respect to underlying layer 17. For reasons to be discussed, a large active region width, w, is possible, and in this example is approximately 6.2 microns.

It should be understood that the "active layer" is the layer (14) in which light is generated by recombination of free carriers therein. The "active region" is the region, including layers 12–17, wherein applied current is confined to produce this recombination, i.e., the region defined by dashed lines 19 and 20. The "blocking region" is the region outside the active region, i.e. outside of the dashed lines, 19 and 20, and includes layers 12–18. The "blocking layer" is the layer, 18, formed over the layers 12–17, which blocks current to the blocking region. In this particular example, only layer 18 provides the blocking function. However, there are other structures where blocking layers are formed adjacent to the active region.

A semiconductor layer, 22, is formed over the blocking layer, 18, and the exposed area of the SCL layer, 17, in the window, 21. In this example, the layer, 22, comprises InGaAsP with a band gap of approximately 1.13 microns and is essentially the same composition as layer 17. While InGaAsP would be preferred for an InP based laser, other materials such as GaAlAs would be more suitable for a GaAs based laser. The layer was deposited by MOCVD to a thickness of approximately 300 angstroms. Other techniques could be used, and the thickness will generally be in the range 100 to 400 angstroms. The index of refraction of the layer, 22, is preferably slightly greater than that of the blocking layer, 18, for reasons to be discussed. The layer, 22, should also preferably be lattice matched to InP.

It should be understood that the "effective refractive index" is the refractive index experienced by the fundamental mode generated in the active region within the active layer, 14, as illustrated by the shaded portion in FIG. 1. while not being bound by any theory, it is believed that it is the difference between this effective refractive index of the active region and the effective refractive index of the blocking region which is adjusted by the presence of the layer 22. As known in the art, the effective refractive index is the average refractive index, weighted by the local mode intensity integrated over the layers that the mode overlaps (layers 12–18, and 22). It is desired to reduce by a small amount the difference between this effective refractive index of the active region and the blocking region so that no transverse modes are supported even while the width, w, is increased. It is believed that the difference between the effective refractive index of the active region and the effective refractive index of the blocking region is most desirably in the range 0.005–0.02. In this example, the difference was approximately 0.01, which was produced by the layer, 22, having a refractive index of 3.28, and the blocking layer, 18, and the cladding layer, 23, both have a refractive index of 3.17. Of course, it will be appreciated that the effective refractive index will also be a function of the thickness of the layers 12–17, and 22, and it is well within the skill of the artisan to provide an propriate index for layer 22 with different layer thickness.

It should be understood that the "effective refractive index" is the refractive index experienced by the fundamental mode generated in the active region within the active layer, 14, as illustrated by the shaded portion in FIG. 1. While not being bound by any theory, it is believed that it is the difference between this effective index of the active region and the effective refractive index of the blocking region which is adjusted by the presence of the layer 22. As known in the art, the effective refractive index is the average refractive index, weighted by the local mode intensity integrated over the layers that the mode overlaps (layers 12–18, and 22). It is desired to reduce by a small amount the difference between this effective refractive index of the active region and the blocking region so that no transverse modes are supported even while the width, w, is increased. It is believed that the difference between the effective refractive index of the active region and the effective refractive index of the blocking region is most desirably in the range 0.005–0.02. In this example, the difference was approximately 0.01, which was produced by the layer, 22, having a refractive index of 3.28, and the blocking layer, 18, and the cladding layer, 23, both have a refractive index of 3.17. Of course, it will be appreciated that the effective refractive index will also be a function of the thickness of the layers 12–17, and 22, and it is well within the skill of the artisan to provide an appropriate index for layer 22 with different layer thickness.

It will be noted further that adjustment of the effective refractive index is enabled by the fact that layer 22 is closer to active layer 14 in the area over the active region than in the area over the blocking region. Thus, layer 22 will have little or no effect on the effective refractive index of the blocking region.

The device is completed by deposition of a cladding layer, 23, on the layer, 22, again by MOCVD, a cap layer, 24, deposited on the cladding layer, 23, and the deposition of electrodes (not shown) on the cap layer and the bottom of the substrate. In this example, the cladding layer, 23, is p-type InP with a thickness of about 2 μm, and the cap layer, 24, is p+ type lattice-matched InGaAs with a thickness of about 0.1 μm.

Figure 2:
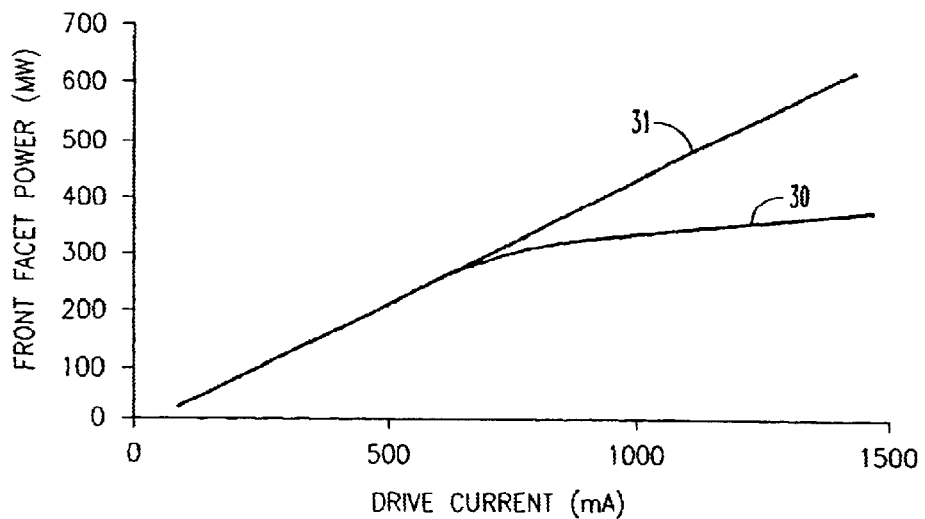
FIG. 2 is an illustration of calculated light output as a function of drive current for the laser of FIG. 1 compared to a prior art laser.

In this particular example, the index of refraction difference allows an expansion of the active region width from a standard 2.4 microns in a capped mesa buried heterostructure (CMBH) to 6.2 microns in this example while still producing single mode emission. Preferably, the active region width is at least 4 μm. FIG. 2 illustrates calculated power v. drive current curves for the conventional CMBH laser (curve 30) and the BRW laser illustrated in FIG. 1. It is apparent that significantly greater power is produced by the laser according to the invention. (For information on a capped mesa buried heterostructure laser, see, e.g., Zilko, et al "Growth and Characterization of High Yield, High Power, High Speed InP/InGaAsP Capped Mesa Buried Heterostructure Distributed Feedback Lasers""IEEE J. of Quantum Electronics, vol. 25, No. 10, pp. 2091–2095 (October 1989).)

Figure 3:
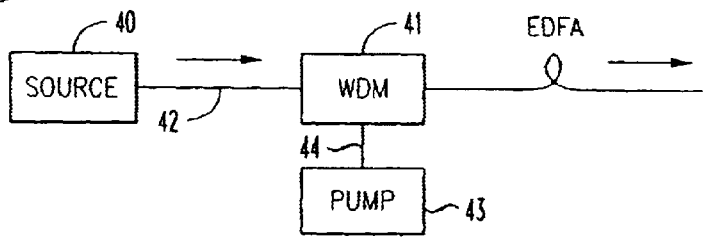
FIG. 3 is a schematic block diagram of a portion of an optical network incorporating features of the invention in accordance with one embodiment.

FIG. 3 illustrates a portion of an optical network which may utilize the present invention. Multiple sources of signal light, 40, are coupled to a wavelength division multiplexer (WDM), 41, through an optical fiber, 42. Typically, the sources are a semiconductor lasers which deliver light of several wavelengths around 1.5 microns. A pump laser, 43, which can be the device of FIG. 1, is also coupled to the WDM, through a single mode fiber, 44. As previously discussed, one of the advantages of the present invention is the ability to couple high power light, advantageously greater than 200 mW, into a single mode fiber. The pump light is typically about 0.98 microns or 1.48 microns in wavelength. The pump and source light are combined through the WDM, 41, into an optical amplifier, which in this example is an Erbium Doped Fiber Amplifier (EDFA) so that the 1.5 μm signal light is amplified for further transmission.

Figure 4:
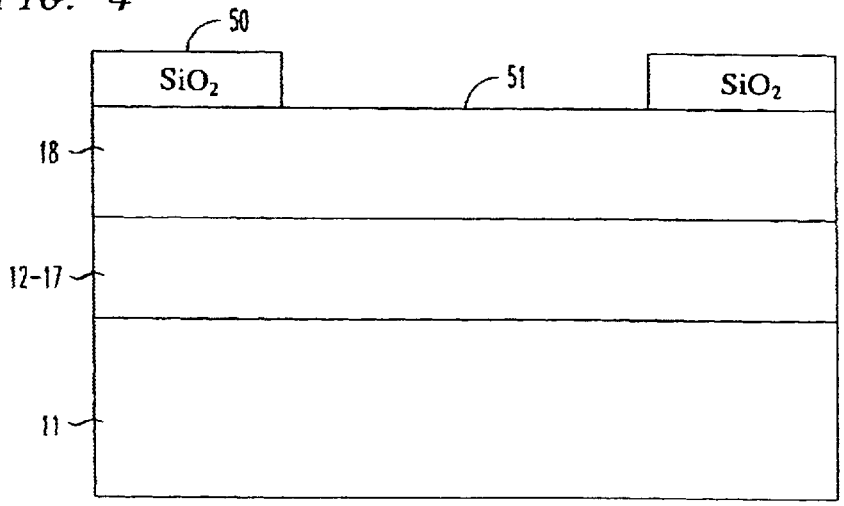
FIGS. 4–6 are cross sectional views of a laser in various stages of fabrication in accordance with one embodiment of the method aspect of the invention.
Figure 5:
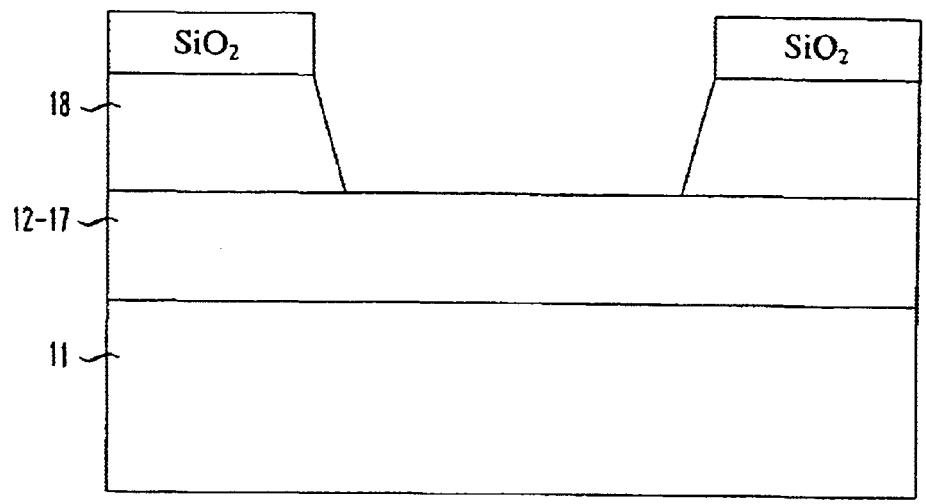
Figure 6:
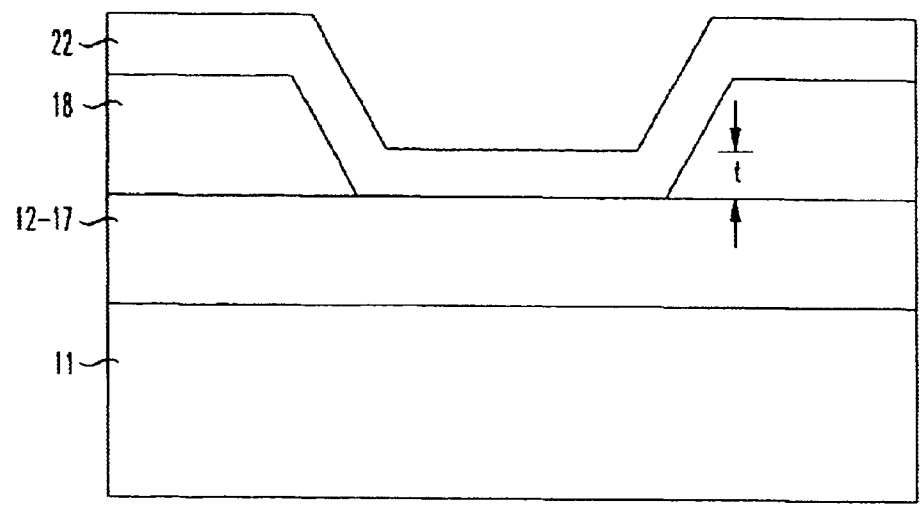

FIGS. 4–6 illustrate various stages of fabrication of the device of FIG. 1. Layers 12–17 (shown as a single layer for purposes of simplicity) have already been deposited by known techniques. Blocking layer, 18, has been deposited by known techniques over essentially the entire surface of layer 17. A mask, 50, has been formed over layer 18, by depositing a layer such as silicon dioxide on essentially the entire top surface of the layer and then photolithographically forming a window, 51, to expose the area of the underlying semiconductor which will comprise the active region.

As illustrated in FIG. 5, the exposed portion of the blocking layer, 18, is etched down to the layer 17 by standard selective chemical etching. The layer, 22, is then deposited over the blocking layer, 18, and the exposed portion of the layer, 17, as illustrated in FIG. 6. Deposition is typically done by Metal Organic Chemical Vapor Deposition (MOCVD). The thickness, t, of the layer at the bottom of the window tends to be thicker than on the sides of the window As previously discussed, the thickness, t, is preferably 100–400 angstroms (10–40 nm). The proportions of the components of layer 22, in this case InGaAsP, are chosen according to known techniques to produce the desired refractive index difference previously discussed. Layers 23 and 24, are successively deposited over the layer 22 by standard techniques as shown in FIG. 1.

What is claimed is:

1. A method of forming a semiconductor optical device comprising the steps of:

forming an active region including an active layer having a first index of refraction;

forming a blocking region having a second, lower index of refaction so that a fundanental mode will be generated in the active layer when a bias is supplied to the device, the mode experiencing effective refractive indices in the active and blocking regions; and forming a semiconductor layer having a third index of refraction greater than the blocking region over both the active and blocking regions so that the semiconductor layer is in closer proximity to the active layer in areas not covered by the blocking region so as to decrease the difference between the effective refractive index of the active region and the effective refractive index of the blocking region.

2. The method according to claim 1, wherein the semiconductor layer comprises InGaAsP.

3. The method according to claim 1, wherein the semiconductor layer is formed by MOCVD.

4. The method according to claim 1, wherein the semiconductor layer is formed over a window etched in a blocking layer.

5. The method according to claim 1, is within the range 0.0005 to 0.02.

6. The method according to claim 1, wherein the thickness of the semiconductor layer is within the range 100 to 400 angstroms.

7. The method according to claim 1, wherein at least two separate confinement layers are formed above the active layer, at least one of said separate confinement layers in contact with the semiconductor layer in an area where the semiconductor layer is in closer proximity to the active layer.

* * * * *

UNITED STATES PATENT AND TRADEMARK OFFICE
CERTIFICATE OF CORRECTION

PATENT NO. : 6,635,502 B1
DATED : October 21, 2003
INVENTOR(S) : Si Hyung Cho et al.

It is certified that error appears in the above-identified patent and that said Letters Patent is hereby corrected as shown below:

Column 2,
Line 9, delete "the farther" and replace with -- a further --.

Column 4,
Line 10, delete "while" and replace with -- While --.
Lines 34 through 60, delete because these lines duplicate lines 7 through 33.

Column 6,
Line 1, delete "then." and replace with -- then --.
Line 7, delete "window" and replace with -- window. --
Line 40, after "claim 1" insert -- wherein the difference between the effective refractive index of the active region and the effective refractive index of the blocking region --.

Signed and Sealed this

Tenth Day of February, 2004

JON W. DUDAS
*Acting Director of the United States Patent and Trademark Office*